United States Patent [19]

Pillari et al.

[11] Patent Number: 4,516,076
[45] Date of Patent: May 7, 1985

[54] FAULT DETECTION ARRANGEMENT FOR RELAY SWITCHING SYSTEM

[75] Inventors: Joseph C. Pillari, Little Ferry; Arthur W. Willging, East Rutherford, both of N.J.

[73] Assignee: The Singer Company, Little Falls, N.J.

[21] Appl. No.: 419,333

[22] Filed: Sep. 17, 1982

[51] Int. Cl.³ .............................................. G01R 31/02
[52] U.S. Cl. .............................. 324/418; 324/73 AT; 324/415; 179/175.21
[58] Field of Search ................... 324/73 AT, 415, 418, 324/421, 422, 423, 51, 133; 179/175.21, 175.3 F

[56] References Cited

U.S. PATENT DOCUMENTS 3,919,504 11/1975 Crosly et al. ....................... 324/415

OTHER PUBLICATIONS

Mano, K. and T. Hosaka, Assurance Test Method for Electromagnetic Relays Using Microprocessor, 26th Relay Conference, Apr. 28-29, 1981; 4—1-4—17.

*Primary Examiner*—Michael J. Tokar
*Assistant Examiner*—Kevin D. O'Shea
*Attorney, Agent, or Firm*—Thomas W. Kennedy

[57] ABSTRACT

An arrangement for detecting faults in automatic test systems of the type wherein test points in a unit under test are connected to test instruments by the programmed closure of electromechanical relay contacts. Respective contacts of the relays are connected to each other and, during periods intermediate of the closure of the relays, a detector circuit is coupled to the interconnected relay contacts. The detector circuit compares a voltage or resistance present on the interconnected relay contacts to a threshold. In one embodiment, if a difference between a signal on the interconnected relay contacts and the threshold persists for a predetermined period, an interrupt signal is generated which prevents further closures of the relays. In this manner, catastrophic failures of the unit under test and the test instruments are prevented.

5 Claims, 5 Drawing Figures

FAULT DETECTION ARRANGEMENT FOR RELAY SWITCHING SYSTEM

BACKGROUND OF THE INVENTION

This invention relates generally to automatic test equipment, and more particularly, to a fault detecting arrangement for determining the presence of fault conditions on a relay bus in an automatic testing system.

A commercially available automatic test system (ATS) utilizes form A relays for interconnecting selected test points in a unit under test (UUT) to one or more measurement instruments. In this known ATS, a plurality of relays of the type wherein ohmic contacts are closed in response to an actuation signal are interconnected such that a first contact from each form A relay is connected to every other first contact of the other form A relays. In this manner, all such interconnected first contacts produce a relay bus.

The second contacts of the relays are connected to respective test points of the UUT, and other ones of such second contacts are connected to the inputs of respective test instruments, such as voltmeters, waveform analyzers, phase-angle voltmeters, counters, etc. A central controller for the ATS, which may be a digital computer, actuates one of the relays to form a connection between a test point in the UUT and a test instrument. Generally, the controller of the ATS is programmed to interconnect the test points to the test instruments in accordance with a predetermined sequence; the test instruments generally being of a programmable type so that the measurement readings can be recorded on a readout medium.

Automated test equipment of the above type suffers from several serious drawbacks. First, if a relay should fail in the closed state, catastrophic damage may result to the UUT and/or the test instruments. Upon the closure of a selected relay in a situation where an earlier closed relay has failed and remains closed, a short circuit across the test points would result through the relays and the relay bus. Clearly, the potential for damage to the UUT is obvious. However, such a short circuit condition may also overload and damage the next selected test instrument, and might also fuse the contacts of the more recently closed relay, thereby resulting in possible damage to the UUT, several relays, and a test instrument. Clearly, the closures of subsequent relays would cause rapidly escalating damage to the systems.

A further problem which is attributable to the use of relays in an ATS concerns the capacitance between the contacts of the relays which are interconnected in the relay bus arrangement. Such capacitance will allow charges to accumulate on the relay bus. This may produce errors in the subsequently measured values. In addition, the closure of a relay in a situation where the bus contains a substantial charge may result in a rapid discharge of the bus through the relay contacts, thereby causing damage to the relay and possible damage to the UUT.

The obvious solution to minimize the problem of fused relay contacts is to restructure the relay switching system to use known form C relays in a binary relay decoding tree configuration. This would assure that no ohmic contact path is created through the switching system from any test point to any other test point. However, this alternate configuration requires a substantially greater number of series relay contact closures to accomplish the equivalent test point to measurement instrument connection. As a result, this alternate configuration often does not provide an adequate low level signal interconnection path capability. Furthermore the use of multiple series relays would be less reliable and may introduce significant signal degradation thereby adversely affecting measurement quality. Finally this type of switching system requires the use of a greater number of larger and more costly relays, thereby significantly limiting package layout and flexibility.

It is, therefore, an object of this invention to provide a fault detection arrangement which prevents the closure of relays when an earlier closed relay has failed and remained closed in a relay bus switching system.

It is a further object of this invention to provide a fault detection arrangement wherein the closure of relays is prevented if the relay bus contains excess charge.

SUMMARY OF THE INVENTION

The foregoing and other objects are achieved by this invention which provides a fault detection arrangement for an ATS of the type wherein the contacts of a plurality of relays are connected to one another to form a relay bus. A sensing arrangement is connected at its input to the relay bus by means of a coupling arrangement having selectable conductive and nonconductive states. The output of the sensing device is connected to a latch circuit which, when a fault condition is present on the relay bus, receives a fault signal from the sensing device and, after a predetermined period of time, interrupts the controller of the ATS so as to prevent further closures of the relays.

In normal operation, the coupling arrangement is in a nonconductive state during the time that the ATS causes a connection between a test point of the UUT and a test instrument to be formed. However, during preselected intervals intermediate of the testing operations by the ATS, the coupling arrangement is rendered conductive so as to determine whether a fault condition is present on the relay bus.

In a preferred embodiment of the invention, the sensing device is in the form of an amplifier having a resistive feedback arrangement. Such resistive feedback provides a conductive path through which a charge which may be stored on the relay bus, as a result of capacitance between the relay contacts, is drawn off until the voltage on the relay bus approximates the voltage on the output terminal of the amplifier. In the preferred embodiment, the voltage at the output terminal of the amplifier is determined by applying a predetermined reference voltage at an input terminal of the amplifier. Thus, when the bus is fully discharged, and all of the relays are open, the voltage on the relay bus will equal the voltage at the output terminal of the amplifier.

It is therefore apparent that the amplifier has two modes of operation; a bus discharge mode and a fault detection mode. As noted, in the bus discharge mode, the bus is discharged to a predetermined reference voltage. As a fault detector, the amplifier and its associated threshold determining circuitry monitor the bus to determine the presence of either a passive resistance or an active voltage source.

Prior to the operation of the UUT and before a command is given to close any of the relays, all relays should be in an open-circuit state. At this time, the sensing device is coupled to the relay bus, and the bus is tested to determine the presence of an impedance, which is illustratively less than 1 megohm. In this manner, the possibility of a catastrophic fault situation is averted. If a fault signal is not generated, the sensing device is uncoupled from the bus and commands are given by the controller of the ATS to close relays which will connect a test point in the UUT to one of the test instruments. Upon completion of the measurement, the closed relays are released, and the sensing device is once again coupled to the relay bus to ascertain that the relays have returned to an open circuit state, and that additional relay failures have not occurred. However, if a failure has occurred, the voltage at the output of the amplifier will exceed a predetermined threshold voltage, the value of which is selected to prevent triggering of the fault indicating circuitry by noise, and a latching circuit will be activated. The latching circuit energizes a display, illustratively an LED, and delivers an interrupt signal to the ATS which prevents further operation of the relays on the relay bus. Such interleaved testing of the bus provides the added advantage of discharging the relay bus prior to each measurement.

In a practicable embodiment of the invention, the relays are arranged into at least two banks, so as to produce two relay buses. At least some of the test instruments are provided with two relays which are associated with respective relay buses to provide a return path. Thus, a test instrument can be connected intermediate of two test points in the UUT. In situations where a return path is not needed, the buses can be operated independently of each other so as to allow two measurements to be taken simultaneously. Alternatively, the use of the buses can be alternated so that one bus is monitored while the other completes a test connection. In one double relay bus embodiment of the invention, each relay bus may be provided with an associated coupling arrangement and sensing device. The relay buses, however, may share a latching device for communicating an interrupt signal to the controller of the ATS.

It is, therefore, a feature of this invention that, in some embodiments, the testing of the relay bus for relay failures can be performed after every measurement operation by the ATS.

It is a further feature of this invention that multiple relay buses can be provided so that measurements of the signals at the test points of the UUT can be performed without waiting for the completion of a fault monitoring and bus discharge procedure.

BRIEF DESCRIPTION OF THE DRAWINGS

Comprehension of the invention is facilitated by reading the following detailed description in conjunction with the annexed drawings in which.

DETAILED DESCRIPTION

Figure 1:
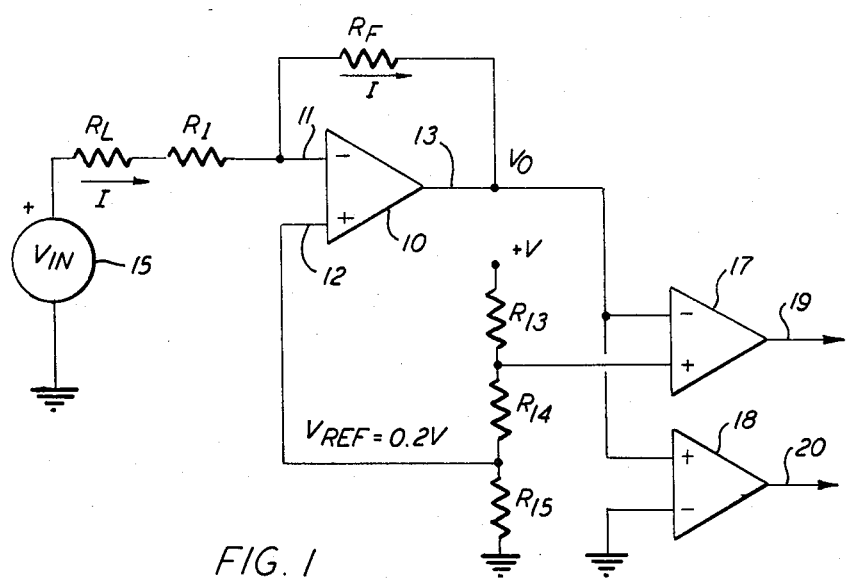
FIG. 1 is a schematic representation of a detector circuit, the representation being useful in explaining the operation of the circuit as a fault detector.

FIG. 1 is a schematic representation of a detector circuit, the representation being adapted to illustrate the manner in which the detector operates as a detector. The detector is provided with an operational amplifier 10 having an inverting input 11, a noninverting input 12 and an output 13. In one practical embodiment of the invention, amplifier 10 is an operational amplifier, illustratively of the commercially available type known as $\mu$A741. Amplifier 10 receives at its input 12 a reference voltage $V_{REF}$ which is produced by operation of a voltage divider having a series combination of resistors $R_{13}$, $R_{14}$, and $R_{15}$. In one embodiment, resistor $R_{13}$ is connected at one terminal thereof to a supply voltage providing illustratively 5 volts DC and a terminal of resistor $R_{15}$ is connected to a reference potential, illustratively ground. The values of the resistors are selected to produce a $V_{REF}$ having a value of approximately 0.2 volts.

Inverting input 11 of amplifier 10 is connected to an equivalent voltage generator 15 which produces an input voltage, $V_{in}$, via resistors $R_L$ and $R_1$. Input voltage $V_{in}$ is the Thevenin equivalent voltage looking into a printed circuit card (not shown) on which the detector circuitry is arranged. Resistor $R_L$ represents the impedance looking into the printed circuit card, and resistor $R_1$ is the input resistance of amplifier 10. A feedback resistor $R_F$ is connected across output terminal 13 and inverting input terminal 11 of the amplifier. A pair of comparators, 17 and 18, are connected at their respective inverting (−) and noninverting (+) input to output 13 of amplifier 10. Comparator 17 is connected at its noninverting input terminal to a node intermediate of resistors $R_{13}$ and $R_{14}$ so as to bear a high reference voltage $V_P$, which in one embodiment may be approximately 0.4 volts. The inverting input of comparator 18 is connected to ground. Thus, when output voltage $V_O$ of amplifier 10 assumes a value greater than 0.4 volts, comparator 17 will issue a signal at its output terminal 19. However, when $V_O$ assumes a value more negative than ground potential, comparator 18 will issue a signal at its output 20. Thus, neither comparator will issue a signal if output voltage $V_O$ has a value between ground (0 volts) and 0.4 volts.

In operation, the circuit of FIG. 1 detects faulty switches by responding to a signal having a value greater than a threshold value at the input of amplifier 10. The threshold value is determined by the gain of amplifier 10 and the reference voltages at the inputs of comparators 17 and 18. The predetermined threshold value is selected to prevent a false alarm signal which may result from the effects of noise. The gain of the amplifier is determined by the input resistance, feedback resistor, and the reference voltage applied at input 12 of the amplifier. Thus, the DC equation for the specific illustrative embodiment described herein is calculated as follows:

$V_{REF} = 0.2$ volts
$R_{14} = R_{15}$ $$\frac{R_{13}}{R_{14}} = \frac{5 - 0.4}{0.2} = 23$$

$$I = \frac{V_{REF} - V_O}{R_F}$$

$$V_{in} = I(R_L + R_1 + R_F) + V_O$$

-continued $$= \frac{V_{REF}}{R_F} - V_o(R_L + R_1 + R_F) + V_o$$

$$= V_{REF} - V_o\left(\frac{R_L + R_1 + R_F}{R_F}\right) + V_o$$

$$= V_{REF}\left(\frac{R_L + R_1 + R_F}{R_F}\right) + V_o\left(\frac{R_F - R_L - R_1 - R_F}{R_F}\right)$$

$$= V_{REF}\left(\frac{R_L + R_1 + R_F}{R_F}\right) - V_o\left(\frac{R_L + R_1}{R_F}\right)$$

$$V_o = \frac{1}{R_L + R_1} ((R_L + R_1 + R_F) V_{REF} - R_F V_{in})$$

When no failure is present, the relay contacts are all open, and therefore:

$$R_L = \infty$$

$$V_o = \left(1 + \frac{R_F}{R_L + R_1}\right) V_{REF}$$

thus, $V_o = V_{REF}$

There are generally two types of failure situations, depending on the value of Vo.
For: Vin = o (no power applied)

$$V_o = \frac{1}{R_L + R_1}(R_L + R_1 + R_F)V_{REF}$$

Thus, Vo is largely determined by $R_L$. However, for; Vin ≠ 0 (power applied)

$$V_o = \left(1 + \frac{R_F}{R_L + R_1}\right) V_{REF} - \frac{R_F}{R_L + R_1} V_{in}$$

$$= V_{REF} + \frac{R_F}{R_L + R_1} (V_{REF} - V_{in})$$

It is therefore evident that this detector circuit is responsive to variations in either input voltage or input impedance. In this manner, a fault is detected irrespective of whether or not power is applied to the UUT. Such sensitivity is achieved by the fact that amplifier 10, which is configured as a negative feedback amplifier, has a large gain factor such that a very small change in the voltage or impedance at its input causes the comparators to change state and thereby trigger an alarm signal, as will be described hereinbelow.

Figure 2:
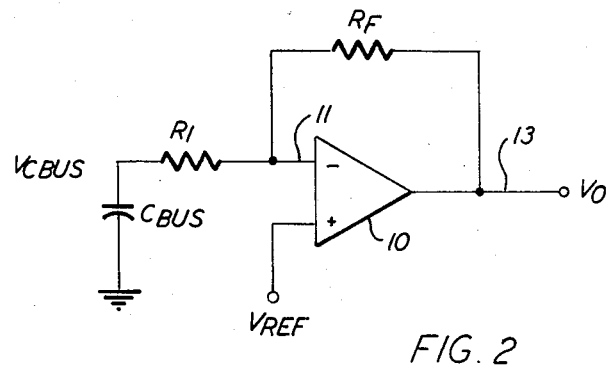
FIG. 2 is a schematic representation of a portion of the detector circuit of FIG. 1, the representation being useful in describing the bus discharge characteristics of the invention.

FIG. 2 is a schematic representation of the detector circuit of FIG. 1 which is configured to illustrate the operation of the circuit in a bus discharge mode. As previously noted, a bus is formed of a plurality of interconnected relay contacts and may assume a generally capacitive characteristic. FIG. 2 shows amplifier 10 connected at its inverting input 11 to a capacitor $C_{BUS}$ via resistor $R_1$. Capacitor $C_{BUS}$ represents the capacitance of the bus and may bear a voltage $V_{CBUS}$ thereacross. Resistors $R_1$ and $R_F$ provide a discharge path as follows:

The discharge current as a function of time is:

$$I_S(t) = \left(\frac{V_{CBUS}(o) - V_{REF}}{R_1}\right) e^{-t/R_1 C_{BUS}}$$

The bus voltage as a function of time is:

$$V_{CBUS}(t) = I_S(t) R_1 + V_{REF}$$

$$= V_{REF} + (V_c(o) - V_{REF}) e^{-t/R_1 C_{BUS}}$$

for $t >> R_1 C_{BUS}$
$V_{CBUS} = V_{REF} = V_o$

Thus, the bus will discharge at a rate which corresponds to $e^{-t/R_1 C_{BUS}}$ until the voltage thereon reaches the value $V_{REF}$. When the bus is fully discharged, $V_o = V_{REF}$, assuming no fault conditions are present and all relays are open circuited.

Figure 3:
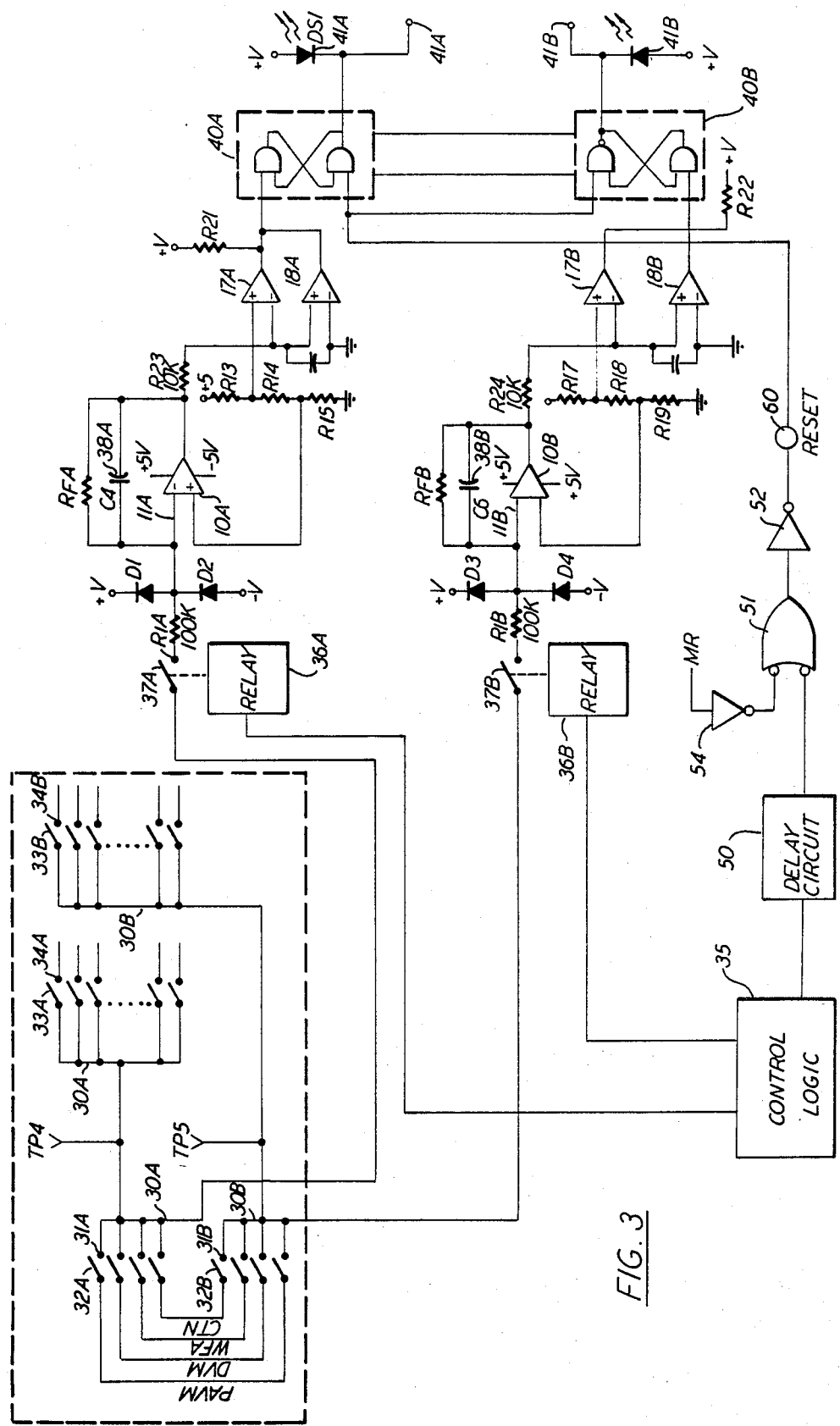
FIG. 3 is a block and schematic representation of the circuit of FIGS. 1 and 2 incorporated in an ATS.

FIG. 3 is a function block and schematic representation of the invention showing the detector circuit of FIGS. 1 and 2 incorporated in an arrangement having two relay buses. Elements of circuit structure having analogous correspondence to the elements discussed with respect to FIGS. 1 and 2 are similarly designated, and the designation may further contain an additional letter which identifies particular ones of replicated circuits.

As shown in FIG. 3, a pair of relay buses 30A and 30B are connected to associated relay contacts which are interconnected so as to form the respective relay buses. For example, relay bus 30A is connected to a first group of relays (not shown) which have interconnected contacts 31A. Each contact 31A is provided with a matching contact 32A which is connected to a respective one of a plurality of test instruments (not shown). In this embodiment, such test instruments may include a phase angle voltmeter (PAVM), a digital voltmeter (DVM), a waveform analyzer (WFA), and a counter (CTR). A further group of relays (not shown) is provided with relay contacts 33A which are each connected to bus 30A. Each relay contact 33A has an associated one of relay contacts 34A. The relay contacts 34A are connected to respective test points in the UUT. In this manner, selected closures of the relay contacts will permit the advantageous interconnection of a test point in the UUT with a desired test instrument. Similarly, relay bus 30B is provided with a plurality of relays for connecting the test instruments to the bus, which relays are provided with respective contacts 32B and 31B. Relay bus 30B is connected to test points in the UUT via further group of relays having respective contacts 33B and 34B. In this manner, selected closures of the relays connected to relay bus 30B provides a conductive path between a test point in the UUT and a test instrument.

The foregoing dual-relay bus arrangement provides several advantages over single bus embodiments. For example, two measurements may be made simultaneously. Alternatively, one of the relay buses may provide a return path so that measurements may be completed across selected test points in the UUT. Moreover, as will be explained hereinbelow, it may be desirable to use a dual-relay bus arrangement even though measurements are performed via only one bus at a time. In such an arrangement, the use of the buses is time division multiplexed, and one bus is tested for faults and discharged while the other performs the measurements.

Such multiplexing greatly accelerates the testing procedure.

FIG. 3 further shows relay bus 30A connected to inverting input terminal 11A of amplifier 10A via a pair of relay contacts 37A of a relay 36A, and resistor R1A. Relays 36A and 36B are controlled by a relay control logic 35 which is incorporated into the ATS. During a time period when all of the relays connected to relay bus 30A are intended to be open circuited, relay 36A will be activated to close contacts 37A by signals from a control logic unit 35, thereby coupling the relay bus to the detector circuit. In this embodiment, input terminal 11A is provided with diodes D1 and D2 which protect the input of the amplifier from excessive voltages. In addition, this embodiment is provided with feedback capacitors 38A and 38B which are connected in shunt with respective feedback resistors $R_{FA}$ and $R_{FB}$. Such feedback capacitors prevent noise from being amplified and further attenuate the noise before passing the signal to the inputs of the comparators.

The outputs of comparators 17A and 18A are connected to each other and to the input of a flip-flop 40A. Similarly, the outputs of comparators 17B and 18B are connected to a flip-flop 40B. Flip-flops 40A and 40B perform as latching devices which maintain a fault state at one of a pair of respective outputs 41A and 41B upon receiving an actuating signal. The output which bears the fault state energizes an associated one of LED devices 41A and 41B which provides a visual indication of the fault condition.

During high speed operation of the ATS, a problem arises as a result of the fact that the mechanical relays may have slightly different response times. Thus, a relay might close its contacts before a prior relay is released. Alternatively, relays 37A and 37B might close before prior relays on their respective relay buses are open circuited. Although such a temporary coincidence of closure between the relays does not warrant the generation of an alarm or an interrupt signal, the momentary signals present at the inputs of the amplifiers may cause flip-flops 40A and 40B to latch, thereby interrupting the ATS.

The foregoing problem of the production of false fault signals produced as a result of simultaneous closure of relay contacts in transition is alleviated, in this embodiment, by a delay circuit 50 which produces a reset pulse having a predeterminable duration. Such a reset signal is conducted from delay circuit 50, through a NOR gate 51 and an inverter 52 to a terminal 60 which is connected to reset input terminal 60 of flip-flops 40A and 40B. The duration of the delay signal which is issued from delay circuit 50 may be selected manually by actuation of a trim potentiometer (not shown) or determined by signals from relay control logic 35. A reset signal MR may be provided via an inverter 54 to allow resetting of flip-flops 40A and 40B after the occurrence and correction of valid fault condition.

Figure 4:
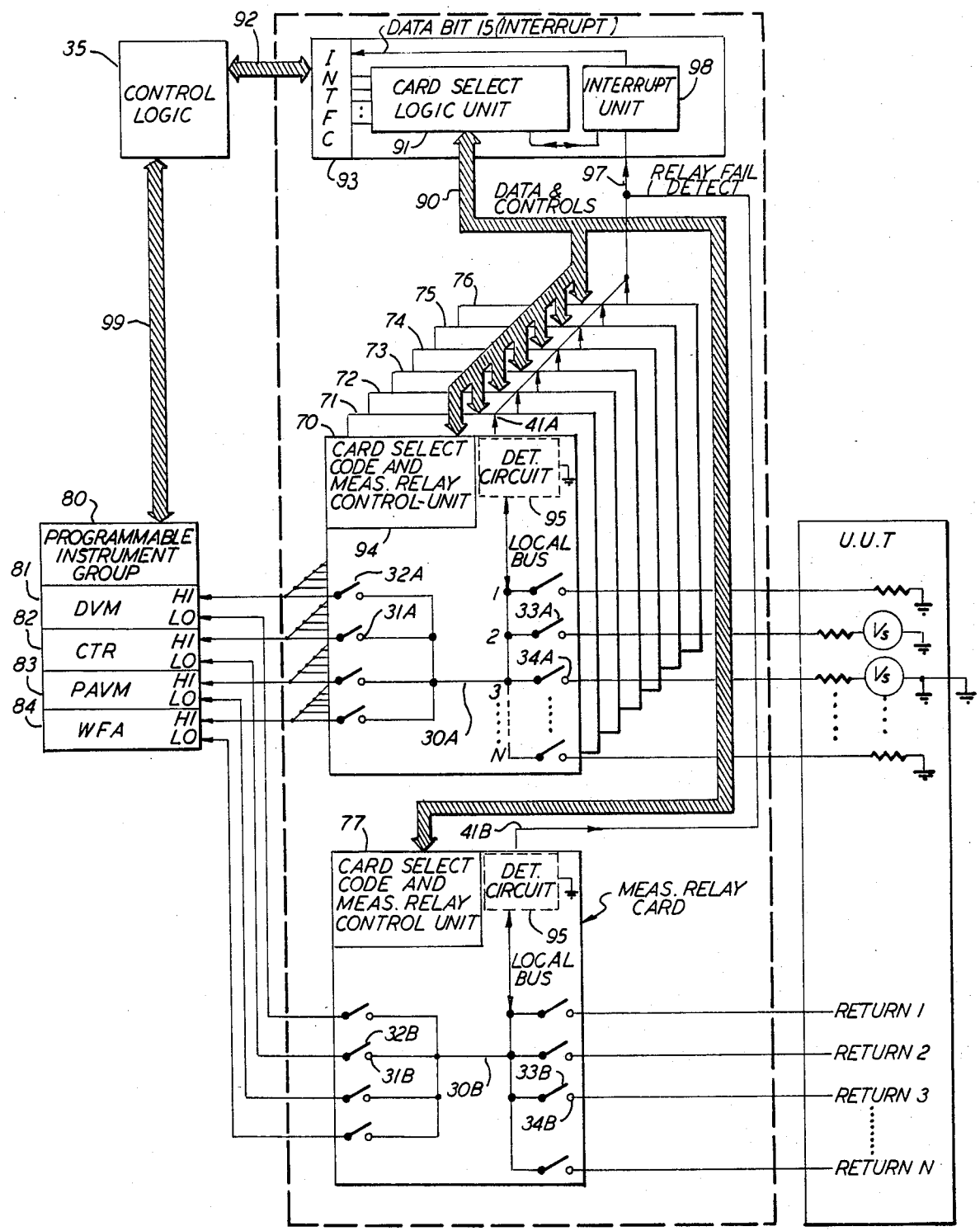
FIG. 4 is an isometrically arranged function diagram of a practical embodiment of the invention.

FIG. 4 shows a particularly advantageous embodiment of the invention wherein a plurality of relays are arranged on each of printed circuit cards 70-77. In the embodiment of FIG. 4, elements of circuit structure which have analogous correspondence to items in FIGS. 1-3 are similarly designated.

FIG. 4 shows a particular embodiment having N relays, illustratively 64 relays, on each printed circuit card for connecting to the UUT. Each card further contains 4 relays for connecting to the inputs of respective instruments in a programmable instrument group 80, which may include a digital voltmeter 81, a counter 82, a phase angle voltmeter 83, and a waveform analyzer 84. As is the case with the embodiment of FIG. 3, the embodiment of FIG. 4 is provided with a plurality of relays for providing a return path.

In the embodiment of FIG. 4, printed circuit cards 70 and 77 contain relay buses 30A and 30B which are described hereinabove with respect to FIG. 3. Thus, FIG. 3 is a simplified, one card embodiment of the invention, having 128 relays for connecting to the UUT, and 8 relays for connecting to the programmable instrument group. FIG. 4, however, shows an embodiment having 8 printed circuit cards, thereby providing 512 relays for connecting to the UUT, and 32 relays for connecting to programmable instrument group 80. A data and control signal bus 90 interconnects each of the printed circuit cards with a card select logic unit 91 which is incorporated in the ATS and selects one of printed circuit cards 70-77 in response to signals from control logic unit 35 which are conducted through a data bus 92 and an interface unit 93. Each such printed circuit card couples to data and control signal bus 90 via a respective card select code and measurement relay control unit 94. In one embodiment, control unit 94 of each printed circuit card may contain a bank of programmable switches for selecting a code which identifies the particular card. Thus, although all such signals are provided to each of the cards, only the particular one of the printed circuit card which identifies its code number will respond to the control signals and data which is issued from card select logic unit 91.

In addition, each of the printed circuit cards is provided with a detector circuit 95 which is similar to the detector arrangement described in FIG. 3. In order to maintain correspondence with the circuitry of FIG. 3, detector circuit 95 of printed circuit board 70 has an output which corresponds to output 41A, and detector circuit 95 of printed circuit card 77 has an output which corresponds to output 41B.

The outputs of the detector circuits in each of the printed circuit cards is combined in a relay fail detect line 97 to an interrupt unit 98. Upon receiving a fault signal, interrupt unit 98 issues an interrupt signal to control logic 35 via interface unit 93 and bus 92.

Control logic unit 35 supplied control signals to programmable instrument 80 via a bus 99. Bus 99 may be of the known IEEE 448 type. In this manner, the ranges and modes of operation of the instruments within programmable instrument group 80 can be controlled by the ATS.

Figure 5:
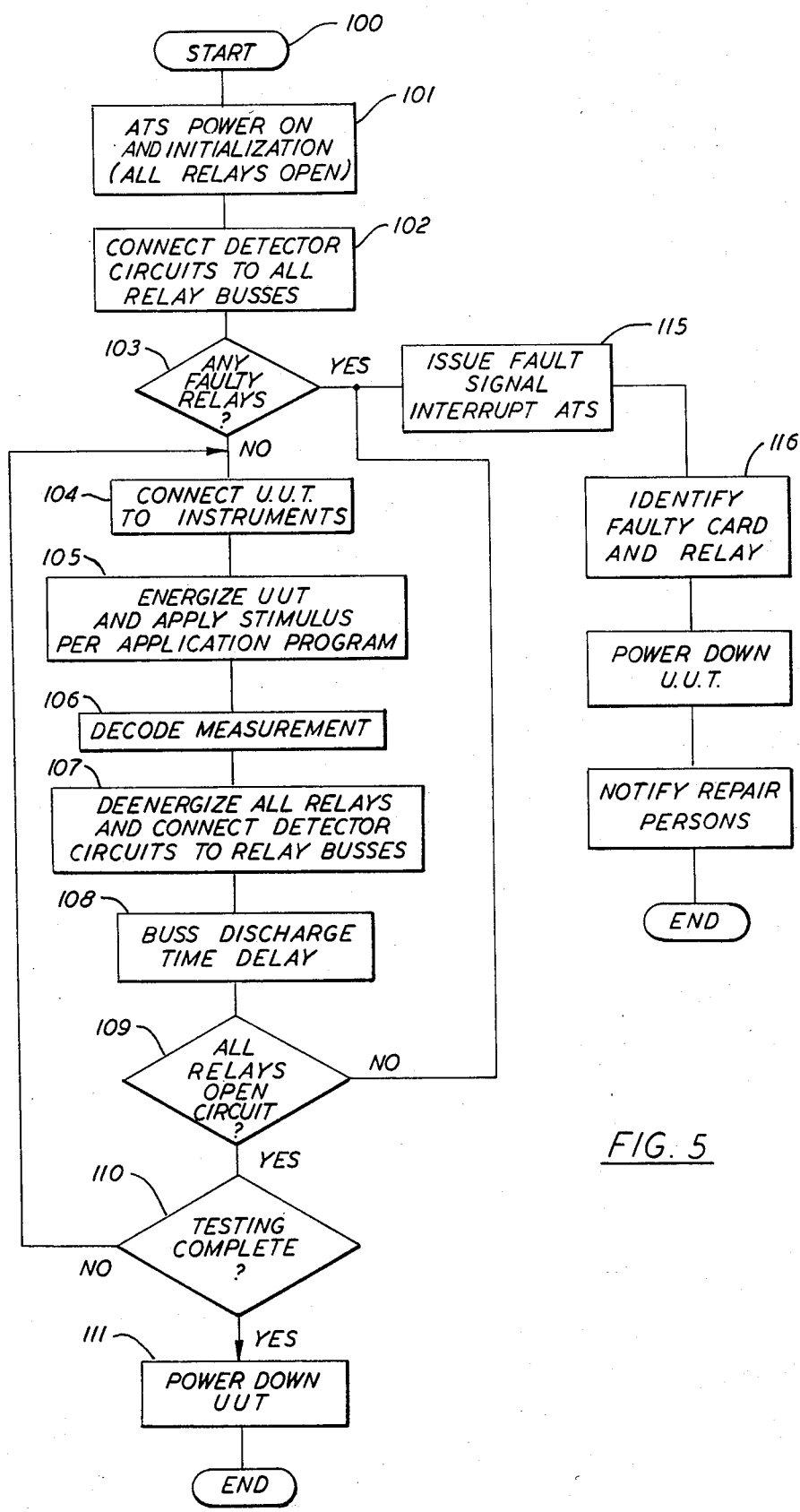
FIG. 5 is a flow diagram of the functional steps which are performed during the operation of the embodiment of FIG. 4.

FIG. 5 is a flow diagram indicating the steps of operation of the embodiment of FIG. 4. After a start command 100 is issued, the ATS is energized and initialized such that all of the relays are intended to be opened, as indicated in step 101. At step 102, the detector circuits are coupled to the relay buses, and a decision is made at step 103 whether any of the relays are faulty. If none of the relays are faulty, the process proceeds to step 104 where the UUT is connected to the programmable instruments. The UUT is energized and receives a preselected stimulus, in accordance with an application program for the particular UUT, at a step 105. The results of the measurements are decoded at step 106 by the control logic. At step 107, all of the relays are deenergized and the detector circuits are reconnected to the relay buses. However, the buses are provided an opportunity to discharge during the execution of step 108. After the discharge period has lapsed, a decision is made at step 109 whether all of the relays are in an opencircuit state. If so, the controller determines whether the programmed testing process has been completed at step 110. If not, the process is continued at step 104 where the UUT is connected to an instrument once again. Alternatively, if testing has been completed, the UUT is deenergized at step 111 and the program is ended.

If during the execution of steps 103 and 109 it is determined that a fault condition exists, a fault signal is issued at step 115 which interrupts further operation of the ATS. Subsequently, a program is run at step 116 which identifies the faulty printed circuit card and the particular relay which has short-circuited. Once this has been determined, the UUT is deenergized and repair persons are notified.

Although the invention herein has been described in terms of specific embodiments and applications, it is to be understood that persons skilled in the art can produce additional embodiments without departing from the spirit or exceeding the scope of the claimed invention. Accordingly, the drawings and descriptions thereof herein should be construed in an illustrative, and not a limiting, sense.

What is claimed is:

1. A fault detecting arrangement in an automatic test system (ATS) for detecting a fault condition on a plurality of relays in a bank of relays in the ATS, the relays each having first and second terminals for forming respective conductive paths therebetween in response to relay control signals, the first terminals of the relays being connected to each other to form a relay bus, the second terminal of at least one of the relays having means for connection to an input of a test instrument, and the second terminals of selected others of the relays having means for connection to respective test points of a unit under test (UUT), the fault detecting arrangement further comprising:

sensing means (10, 11, 12, 13, $R_F$, 17, 18, 19, 20) having sensing means input and output terminals for producing a fault signal at said sensing means output terminal responsive to an input signal at said sensing means input terminal; and coupling means (35, 36, 37) having conductive and nonconductive states selectable in response to test mode control signals from the ATS for selectably connecting the relay bus to said sensing means input terminal during conductive states, wherein said sensing means further comprises:

amplifier means (10, 12) having a first amplifier input terminal for receiving a reference voltage signal, a second amplifier input terminal (11) connected to said sensing means input terminal, and an amplifier output terminal (13) for producing a signal responsive to a bus signal on said relay bus and said reference voltage signal; and feedback means ($R_F$) connected across said second amplifier input and said amplifier output terminals, and wherein said feedback means ($R_F$) forms a discharge path when said coupling means is in said conductive state for discharging the relay bus, and wherein said sensing means further comprises threshold detector means (17, 18) having a first detector input terminal connected to said amplifier output terminal, a second detector input terminal for receiving a threshold value, and a detector output terminal (19, 20) connected to said sensing means output terminal, and wherein there is further provided latch means (40A, 40B) connected to said sensing means output terminal for receiving said fault signal, said latch means further having a latch output terminal (41A, 41B) for producing an interrupt signal for the ATS which disables the relay control signals.

2. The fault detecting arrangement of claim 1 wherein said latch means is further provided with at least one display means responsive to said interrupt signal for providing a visual indication of a fault condition; and wherein said latch means is a flip-flop and said display means is a light-emitting diode; and wherein there is further provided reset means (60) for resetting said flip-flop during predetermined time periods when said coupling means is in transition between said conductive and nonconductive states, and wherein said coupling means comprises a coupling relay, and control logic for automatically actuating the relay.

3. An apparatus for sequentially interconnecting a plurality of test points in a UUT with at least one test instrument, the apparatus being of the type wherein the sequential interconnections are made upon the closure of first and second contacts of electromechanical relays, the first contact of each such relay being connected to the respective first contacts of every other such relay, the apparatus comprising:

test means (10, 11, 12, 13, $R_F$, 17, 19) for determining fault situations on the interconnected first contacts of the electromechanical relays;

coupling means (35, 36, 37) for connecting said test means to the interconnected first contacts of the electromechanical relays at times intermediate of the sequential interconnections between the test points in the UUT and the test instrument; and disabling means (40A, 40B, 41A, 41B) for preventing subsequent ones of the sequential interconnections between the test points in the UUT and the test instrument when said test means determines the presence of a fault situation on the interconnected first contacts of the electromechanical relays, and wherein said disabling means is further provided with delay means (50) for delaying said prevention of said subsequent ones of the sequential interconnections by a predetermined period of time, and wherein said disabling means comprises a flip-flop (40A, 40B) having set and reset input terminals, and wherein said delay means comprises delay signal means (51, 52, 60) for providing a reset signal to said reset input terminal of said flip-flop and wherein said reset signal from said delay signal means has a duration which closely approximates said predetermined period of time by which said prevention of said subsequent ones of the sequential interconnections is delayed.

4. The apparatus of claim 3 further comprising discharge means for removing an electrical charge stored on the connected first contacts of the electromechanical relays; and wherein said test means comprises an amplifier; and wherein said discharge means forms a feedback path for said amplifier; and wherein said amplifier has an input for receiving a reference potential, said discharge means removing said electrical charge stored on the connected first contacts of the electromechanical relays until a voltage on the first contacts is approximately equal to said reference potential.

5. A method for testing a UUT, the method being of the type having the steps of energizing the UUT, closing at least a first relay which is serially connected between a first test point in the UUT and a test instrument, opening the first relay, and closing at least a second relay which is serially connected between a second test point in the UUT and the test instrument, the method comprising the further steps of:

connecting a detector circuit to the first relay after the step of energizing the UUT and before the step of closing the first relay;

comparing a signal from said detector circuit against a predetermined threshold potential;

preventing said step of closing the first relay if said signal from said detector differs from said predetermined threshold potential by a predetermined amount;

delaying said preventing step by a predetermined delay period of time;

executing said preventing step if said difference between said detector signal and said predetermined threshold potential persists for a period longer than said predetermined delay period, and discharging said first relay during said predetermined delay period; wherein said preventing step comprises the further steps of:

producing a latching signal having a selectable and indefinite duration; and generating a visual display in response to said latching signal, and wherein after said step of opening the first relay there are provided the further steps of:

connecting said detector circuit to the second relay before the closing of the second relay;

comparing a further signal from said detector circuit against said predetermined threshold potential; and preventing said step of closing the second delay if said further signal from said detector differs from said predetermined threshold potential by said predetermined amount.

* * * * *